(12) United States Patent
Hansen et al.

(10) Patent No.: US 7,501,836 B2
(45) Date of Patent: Mar. 10, 2009

(54) APPARATUS AND METHOD FOR DETERMINING CAPACITANCE VARIATION IN AN INTEGRATED CIRCUIT

(75) Inventors: James E. Hansen, Loveland, CO (US); Robert H. Hansen, Firestone, CO (US); Gregory J. Milburn, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 164 days.

(21) Appl. No.: 11/599,027

(22) Filed: Nov. 14, 2006

(65) Prior Publication Data

US 2008/0111562 A1    May 15, 2008

(51) Int. Cl.
    *G01R 27/26* (2006.01)
(52) U.S. Cl. .................................. 324/679; 324/658
(58) Field of Classification Search ............. 324/679
    See application file for complete search history.

(56) References Cited

U.S. PATENT DOCUMENTS

| | | | | |
|---|---|---|---|---|
| 6,404,074 B2* | 6/2002 | Saito et al. | ................. | 307/10.1 |
| 6,472,886 B2* | 10/2002 | Lee | ........................... | 324/659 |
| 6,501,282 B1* | 12/2002 | Dummermuth et al. | ..... | 324/679 |
| 6,756,792 B2* | 6/2004 | Armbruster | ................. | 324/687 |
| 7,342,406 B2* | 3/2008 | Bhushan et al. | ............. | 324/765 |
| 2003/0076120 A1* | 4/2003 | DeHart | ....................... | 324/694 |
| 2005/0253597 A1* | 11/2005 | Miller | ........................ | 324/662 |
| 2006/0033508 A1* | 2/2006 | Lee | ............................ | 324/678 |

\* cited by examiner

*Primary Examiner*—Diego Gutierrez
*Assistant Examiner*—Jeff Natalini (57) ABSTRACT

An apparatus for determining capacitance variation in an integrated circuit, includes at least two capacitances, a stimulus provided to the at least two capacitances, and a first logic element coupled to the stimulus and the at least two capacitances, the first logic element configured to switch state upon a state transition of the stimulus when the at least two capacitances differ in value by a predetermined amount.

20 Claims, 6 Drawing Sheets

APPARATUS AND METHOD FOR DETERMINING CAPACITANCE VARIATION IN AN INTEGRATED CIRCUIT

BACKGROUND

As integrated circuits become increasingly compact, processing dimensions continue to shrink. One result of shrinking process dimensions is the impact of parasitic capacitance and parasitic capacitance variations within the integrated circuit. Parasitic capacitance can be described as capacitance that is not taken into account when considering ideal circuit elements. Parasitic capacitance causes operating anomalies in the integrated circuit and when severe, can cause the integrated circuit to malfunction, or function at a level below its intended performance level. The effects of parasitic capacitance become more significant as the physical size of the circuitry is made smaller.

When an integrated circuit is designed, capacitance values are calculated based on the performance of ideal circuit elements and the values for parasitic capacitances are estimated based on factors such as the physical layout of the circuit. However, when the circuit is fabricated, process variations, such as physical size of conductors and traces, process variation over time, temperature variations, and other variations in the processing of the integrated circuit, give rise to parasitic capacitance variation. Further, variations in parasitic capacitances over two or more identically designed portions of the integrated circuit reduce the performance of the circuit and make circuit performance even more difficult to predict.

Therefore, it would be desirable to have a way to determine capacitance variations over an integrated circuit.

SUMMARY

In an embodiment, an apparatus for determining capacitance variation in an integrated circuit comprises at least two capacitances, a stimulus provided to the at least two capacitances, and a first logic element coupled to the stimulus and the at least two capacitances, the first logic element configured to switch state upon a state transition of the stimulus when the at least two capacitances differ in value by a predetermined amount.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

2

DETAILED DESCRIPTION

Embodiments of the apparatus for determining capacitance variation in an integrated circuit to be described below will be described in the context of an integrated circuit, or a number of integrated circuit portions formed on a single die, also referred to as a "chip." However, the apparatus for determining capacitance variation in an integrated circuit can be implemented in any circuitry in which it is desirable to determine whether variations in capacitance exist. The apparatus for determining capacitance variation in an integrated circuit will also be referred to below as a capacitance variation determination circuit.

Figure 1:
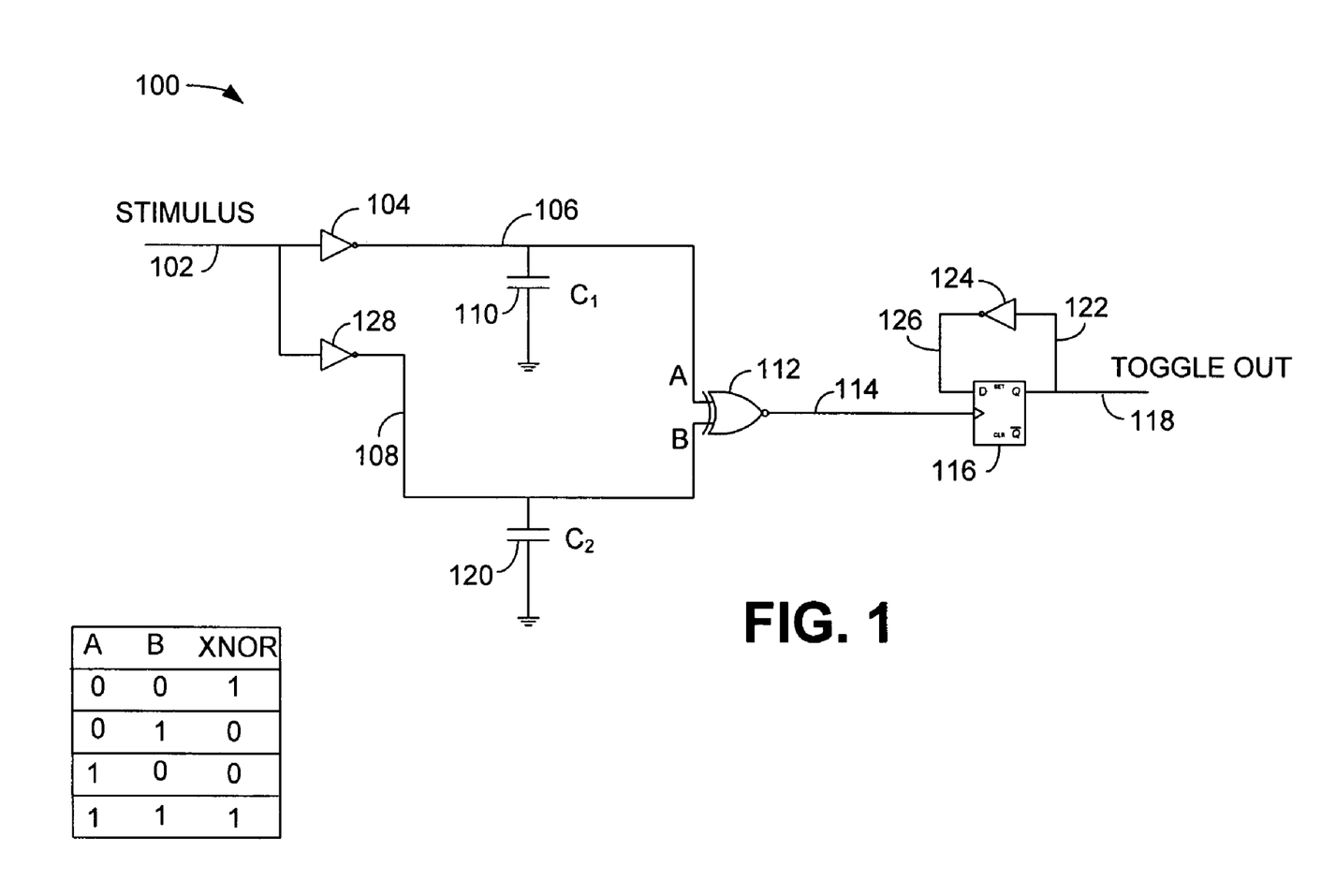
FIG. 1 is a block diagram illustrating an embodiment of an apparatus for determining capacitance variation in an integrated circuit.

FIG. 1 is a block diagram illustrating an embodiment of a capacitance variation determination circuit 100 for determining capacitance variation in an integrated circuit. The capacitance variation determination circuit 100 includes a buffer 104 and a buffer 128 configured to receive a stimulus signal over connection 102. The buffers 104 and 128 are designed to have a substantially similar response. The stimulus signal can be a clock signal having positive or negative polarity, can be a differential signal, or can be any other signal that can be used to stimulate the capacitance variation determination circuit 100. In an embodiment, the stimulus signal is a clock signal provided by circuitry (not shown) located elsewhere on an integrated circuit chip on which the capacitance variation determination circuit 100 is also located. Further, the capacitance variation determination circuit 100 is responsive to either a leading edge or a falling edge of the stimulus signal provided on connection 102.

An output of the buffer 104 on connection 106 is coupled to a first capacitance 110, also referred to as $C_1$, and an output of the buffer 128 on connection 108 is coupled to a second capacitance 120, also referred to as $C_2$. Although shown schematically as capacitors, the capacitances 110 and 120 can be any combination of design capacitances, parasitic capacitances generated by data lines, circuit traces, or any other circuit components that generate capacitance. In this example, the capacitances 110 and 120 are coupled to system ground. However, the capacitances 110 and 120 can alternatively be coupled to any circuit node within an integrated circuit in which the capacitance variation determination circuit 100 is implemented.

The capacitance 110 is coupled to a first input of a logic element. In this example, the logic element 112 is an exclusive nor gate (XNOR). However, other logic elements can be implemented. Any device that compares input voltages and generates a different output when the input voltages differ opposed to when the input voltages are the same could be used, such as, for example, an XOR gate, a comparator, etc. The first input of the logic element 112 is also referred to as node "A." The capacitance 120 is coupled to a second input of the logic element 112. The second input of the logic element 112 is also referred to as node "B."

The output of the logic element 112 is supplied on connection 114 to a clock input of a logic element 116. In this example, the logic element 116 is a "D" flip-flop. The "Q" output of the logic element 116 is the output 118 of the capacitance variation determination circuit 100. The output 118 is referred to as TOGGLE OUT. The output 118 of the logic element 116 is fed back via connection 122 to the inverter 124. The output of the inverter 124 is supplied to the "D" input of the logic element 116 via connection 126. In accordance with an embodiment of the capacitance variation determination circuit 100, a stimulus signal input on connection 102 will change, also referred to as "toggle," the logic state of the logic element 112 only when there is a capacitance variation between the capacitances 110 and 120 that exceeds a threshold amount. Stated another way, the logic element 112 will not change logic state when the inputs on nodes A and B are the same logic value. The nodes A and B will remain the same logic value on a transition of the stimulus signal on connection 102 only if the capacitances 110 and 120 are within a threshold amount.

The threshold for determining whether the logic element 112 will change state on a transition of the stimulus signal on connection 102 due to a capacitance difference between the capacitances 110 and 120 is determined by circuitry associated with the clock input 114 of the logic element 116. Generally, a D flip-flop triggers when the logic level of the input clock signal is near the midpoint between its minimum and maximum values. However, a flip-flop can be designed to trigger at higher or lower values. This trigger point varies with process and environment, and this variation is determined and accounted for in the design of the flip-flop.

Further, the design of the logic element 112 has an influence on the triggering threshold of the logic element 116 and should be designed as a unit with the logic element 116. Ideally, the logic element 112 would provide a full logic transition when there is a difference between the capacitances 110 and 120. This full logic transition would be of full logic value and of the exact length of time that the inputs A and B differ. This full logic transition effectively clocks the logic element 116. However, because the logic element 112 is not ideal, the logic element 112 should be designed to provide a logic transition of known value when its inputs are different for a certain amount of time. The logic element 116 should be designed to toggle with this known logic transition. Also, the capacitance at the inputs of the logic element 112 should be very small compared to the capacitance values that are being compared, capacitances 110 and 120 in this example. A commonly used flip-flop in a 1.2V 90 nanometer (nm) complementary metal-oxide semiconductor (CMOS) process has an input threshold of 0.6V+/−0.1V and the toggle will be either from 1.2 v to 0 V or from 0 V to 1.2 V, depending on the previous state of the flip-flop.

The logic element 112 will not change state if the inputs at nodes A and B are substantially the same value, i.e., within a threshold difference. The logic element 112 will change state only when there is a difference in value between the nodes A and B that exceeds the threshold value. This difference in value between node A and node B caused by the difference in capacitance value between capacitances 110 and 120 can be characterized as an anomaly at the inputs of the logic element 112. If the anomaly at the inputs to the logic element 112 is of sufficient magnitude, the anomaly may cause instability in the logic element 112 sufficient to cause the logic element to transition state temporarily. The instability is sometimes referred to as a "glitch." Further, it is this capability of the logic gate 112 (an XOR gate in this example) to react to an anomaly at its inputs, that generally discourage the implementation of an XOR (or an XNOR) gate to drive the clock input of a flip-flop.

Figure 2:
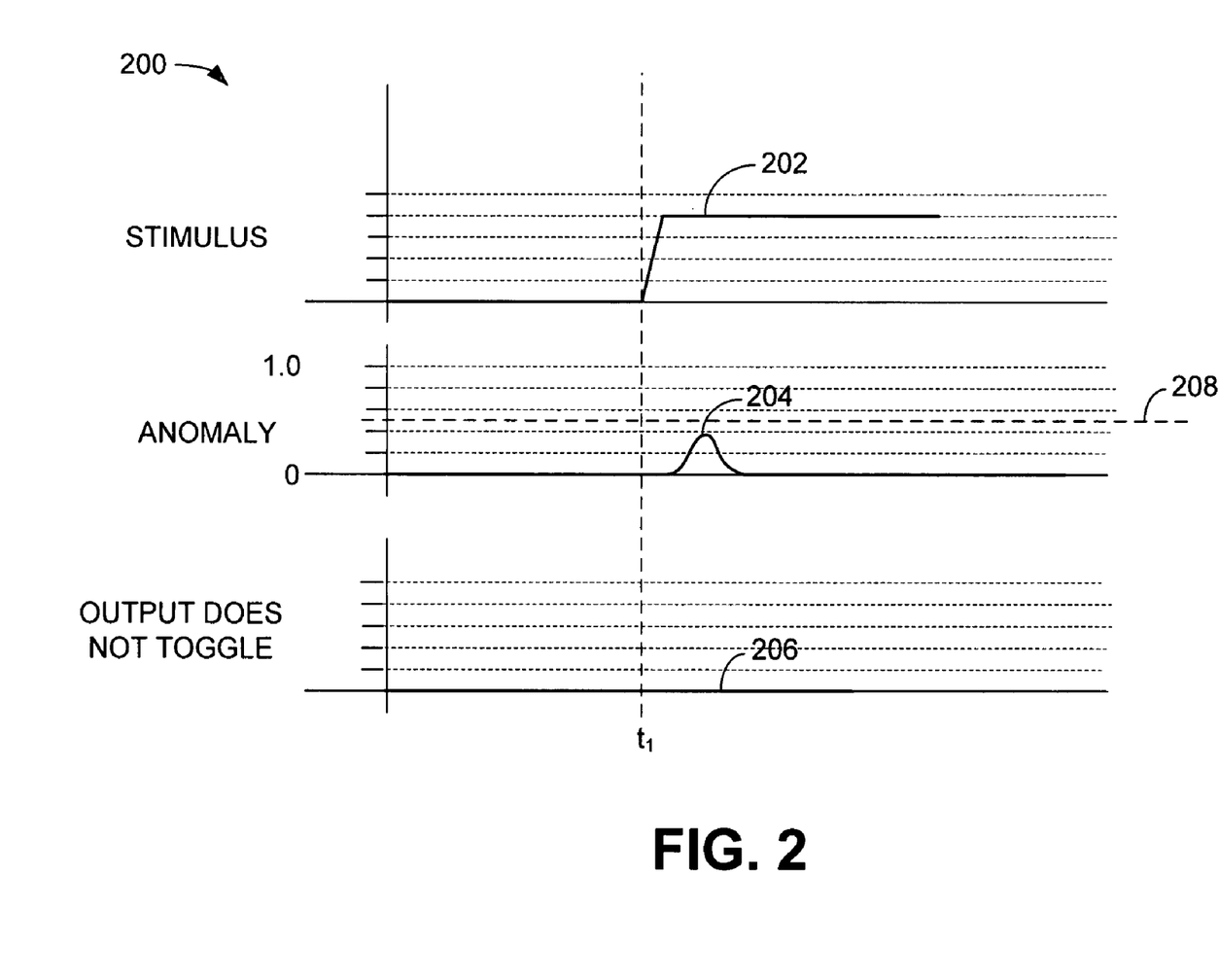
FIG. 2 is a timing diagram illustrating a first operating state of the apparatus for determining capacitance variation in an integrated circuit of FIG. 1.

FIG. 2 is a timing diagram 200 illustrating a first operating state of the apparatus for determining capacitance variation in an integrated circuit of FIG. 1. The stimulus signal is indicated using trace 202. While shown as transitioning from a logic low state to a logic high state, the stimulus signal can also transition from a logic high state to a logic low state. At a time $t_1$, the stimulus signal transitions from a logic low state to a logic high state. The output of the logic element 112 (FIG. 1) is shown using trace 204. The output of the logic element 116 (FIG. 1) is shown using trace 206. As shown in the timing diagram 200, the logic transition of the stimulus signal on connection 102 (FIG. 1) causes an anomaly at the logic element 112. However, because the values of the capacitances 110 and 120 (FIG. 1) differ by less than a threshold amount, the anomaly, which is illustrated using trace 204, is insufficient to cause the logic element 112 to change state. For this example, the threshold at which the logic element 112 changes state is illustrated using trace 208. In the example shown in FIG. 2, the level of the anomaly shown using trace 204 is approximately 0.4 volts at its maximum value, which is insufficient to cause the logic element 112 to change state when the logic element 112 is implemented with the logic element 116. As mentioned above, the logic element 112 and the logic element 116 should be designed such that an anomaly at the output of the logic element 112 that exceeds a predetermined threshold will be sufficient to toggle the logic element 116.

In the example shown in FIG. 2, using the above-mentioned 1.2V 90 nm CMOS process, for $C_1=5$ femtofarads (fF) and 2 fF<$C_2$<7 fF, the output anomaly is not sufficient to cause the output of the logic element 112 to toggle. Therefore, in this example, the threshold capacitance variation between the capacitances 110 and 120 that would cause the output of the logic element 112 to toggle is approximately 2-3 fF. However, it should be noted that this example uses standard gates that are not optimized for a particular application. In a particular design implementation, the gates would be designed to be sensitive to a particular, and a smaller or larger capacitance variation.

Figure 3:
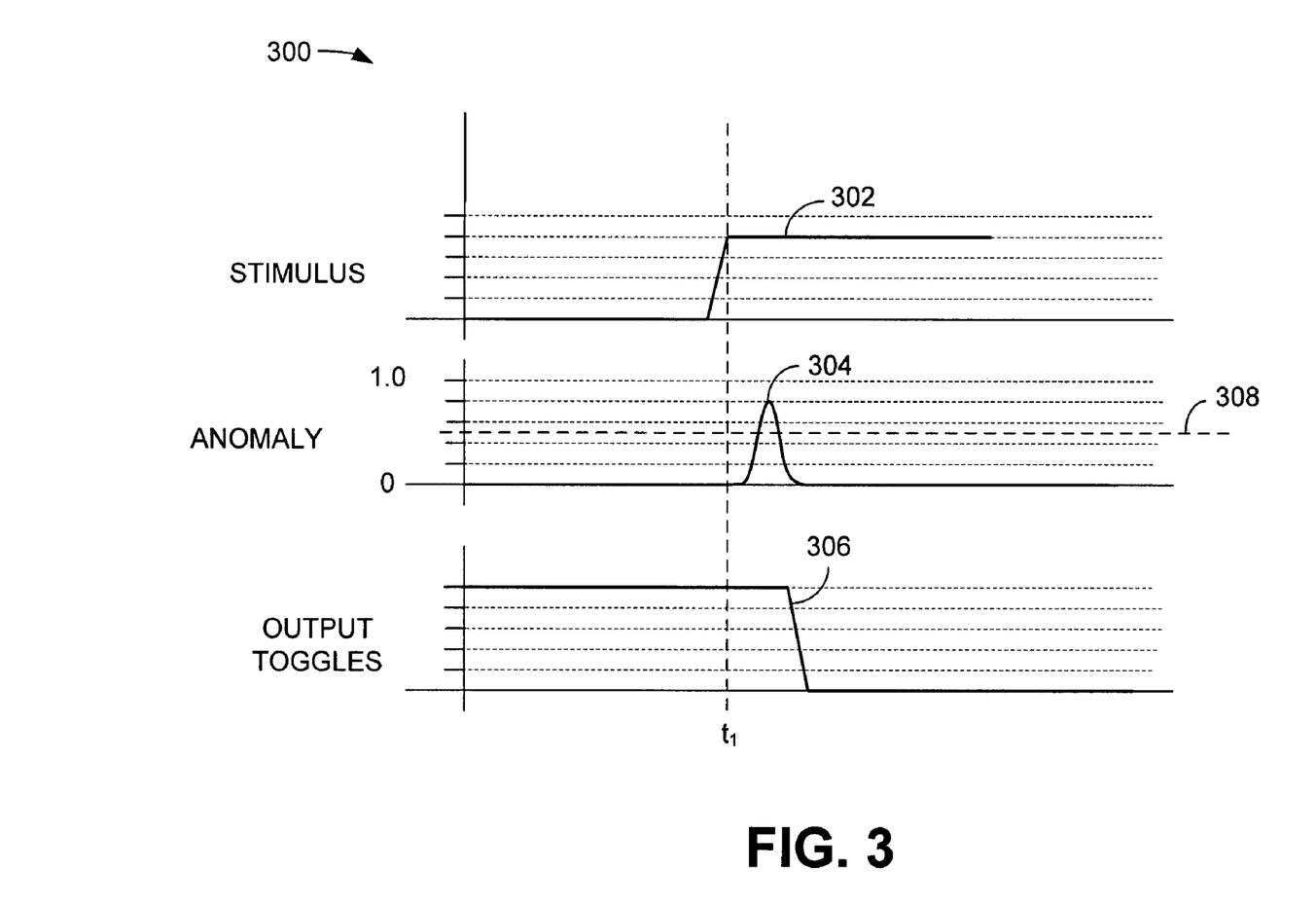
FIG. 3 is a timing diagram illustrating a first operating state of the apparatus for determining capacitance variation in an integrated circuit of FIG. 1.

FIG. 3 is a timing diagram 300 illustrating a second operating state of the apparatus for determining capacitance variation in an integrated circuit of FIG. 1. The stimulus signal is indicated using trace 302. While shown as transitioning from a logic low state to a logic high state, the stimulus signal can also transition from a logic high state to a logic low state. At a time $t_1$, the stimulus signal transitions from a logic low state to a logic high state. The output of the logic element 112 (FIG. 1) is shown using trace 304. The output of the logic element 116 (FIG. 1) is shown using trace 306. As shown in the timing diagram 300, the logic transition of the stimulus signal on connection 102 (FIG. 1) causes an anomaly at the logic element 112. However, in this operating state, and because the values of the capacitances 110 and 120 (FIG. 1) differ by more than a threshold amount, the anomaly, which is illustrated using trace 304, is sufficient to cause the logic element 112 to change state. For this example, the threshold at which the logic element 112 changes state is illustrated using trace 308. In the example shown in FIG. 3, the level of the anomaly shown using trace 304 is approximately 0.8 volts, which is sufficient to cause the logic element 112 to change state when the logic element 112 is implemented with the logic element 116. As mentioned above, the logic element 112 and the logic element 116 should be designed such that an anomaly at the output of the logic element 112 that exceeds a predetermined threshold will be sufficient to toggle the logic element 116.

In the example shown in FIG. 3, using the above-mentioned 1.2V 90 nm CMOS process, for $C_1=5$ fF and $C_2<=2$ fF or $C_2>=8$ fF, the output anomaly is sufficient to cause the output of the logic element 112 to toggle. Therefore, for this particular case, a capacitance variation of 3 fF between the capacitances 110 and 120 will cause the output to toggle from a first state to a second state. However, it should be noted that this example uses standard gates that are not optimized for a particular application. In a particular design implementation, the gates would be designed to be sensitive to a particular, and a smaller or larger capacitance variation.

The values of the signals on the inputs at node A and node B of the logic element 112 may differ because there is a significant difference in the value of the capacitances 110 and 120 (FIG. 1). A significant difference between the value of the capacitances 110 and 120 (FIG. 1) is one that causes an anomaly at the inputs on nodes A and B of the logic element 112 sufficient to cause the logic element 112 to transition state. When the inputs to the logic element 112 differ by an amount that exceeds the threshold amount, the logic element 112 changes state. When the logic element 112 (FIG. 1) changes state, the logic element 116 is caused to toggle, thus providing an output on connection 118. The output on connection 118 is coupled to circuitry (not shown) that can be read out of the integrated circuit and be provided to a user, instructing the user that there is a capacitance variation between the capacitances 110 and 120 (FIG. 1) that exceeds a threshold amount. In this manner, capacitance variation between capacitances can be detected and communicated to a user.

Figure 4:
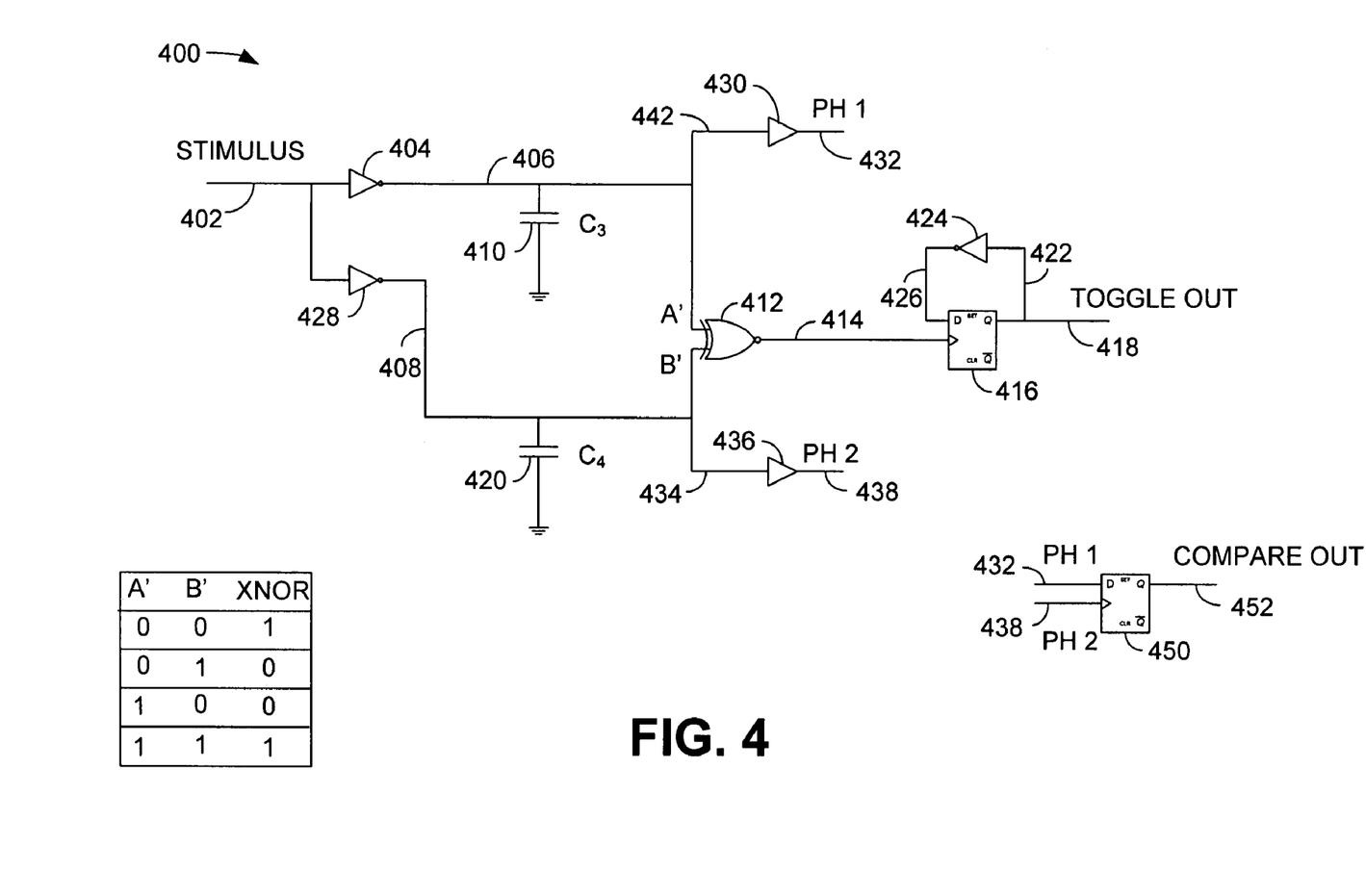
FIG. 4 is a schematic diagram illustrating an alternative embodiment of the capacitance variation determination circuit of FIG. 1.

FIG. 4 is a schematic diagram illustrating an alternative embodiment of the capacitance variation determination circuit of FIG. 1. The capacitance variation determination circuit 400 is similar to the capacitance variation determination circuit 100 of FIG. 1. However, in addition to providing an indication of a difference between capacitances the capacitance variation determination circuit 400, provides an indication of which capacitance is larger. The capacitance variation circuit 400 includes a buffer 404 and a buffer 428 configured to receive a stimulus signal over connection 402. The stimulus signal is similar to the stimulus signal described above.

An output of the buffer 404 on connection 406 is coupled to a first capacitance 410, also referred to as $C_3$, and an output of the buffer 428 on connection 408 is coupled to a second capacitance 420, also referred to as $C_4$. Although shown schematically as capacitors, the capacitances 410 and 420 can be parasitic capacitances generated by data lines, circuit traces, or any other circuit components that generate capacitances. In this example, the capacitances 410 and 420 are coupled to system ground. However, the capacitances 410 and 420 can alternatively be coupled to any circuit node within an integrated circuit in which the capacitance variation determination circuit 400 is implemented.

The capacitance 410 is coupled to a first input of a logic element. In this example, the logic element 412 is an exclusive nor gate (XNOR). However, other logic elements can be implemented, as described above. The first input of the logic element 412 is also referred to as node "A'." The capacitance 420 is coupled to a second input of the logic element 412. The second input of the logic element 412 is also referred to as node "B'."

The output of the logic element 412 is supplied on connection 414 to a clock input of a logic element 416. In this example, the logic element 416 is a "D" flip-flop. The "Q" output of the logic element 416 is the output 418 of the capacitance variation determination circuit 400. The output 418 of the logic element 416 is fed back via connection 422 to inverter 424. The output of the inverter 424 is supplied to the "D" input of the logic element 416 via connection 426. In accordance with an embodiment of the capacitance variation determination circuit 400, a stimulus signal input on connection 402 will toggle the logic state of the logic element 412 only when there is a capacitance variation between the capacitances 410 and 420 that exceeds a threshold amount. Stated another way, the logic element 412 will not change state when the inputs on nodes A' and B' are the same logic value. The nodes A' and B' will remain the same logic value on a transition of the stimulus signal on connection 402 only if the capacitances 410 and 420 are within a threshold amount.

The threshold for determining whether the logic element 412 will change state on a transition of the stimulus signal on connection 402 due to a capacitance difference between the capacitances 410 and 420 is determined by circuitry associated with the clock input 414 of the logic element 416. Generally, a D flip-flop triggers when the logic level of the input clock signal is near the midpoint between its minimum and maximum values. However, the flip-flop can be designed to trigger at higher or lower values. This trigger point does vary with process and environment, and this variation is determined and accounted for in the design of the flip-flop.

Further, the design of the logic element 412 has an influence on the triggering threshold of the logic element 416 and should be designed as a unit with the logic element 416. Ideally the logic element 412 would provide a full logic transition when there is a difference between the capacitances 410 and 420. This full logic transition would be of full logic value and of the exact length of time that the inputs are different. This full logic transition effectively clocks the logic element 416. However, because the logic element 412 is not ideal, the logic element 412 should be designed to provide a logic transition of known value when its inputs are different for a certain amount of time. The logic element 416 should be designed to toggle with this known logic transition. Also, the capacitance at the inputs of the logic element 412 should be very small compared to the capacitance values that are being compared, capacitances 410 and 420 in this example.

The logic element 412 will not change state if the inputs at nodes A' and B' are substantially the same value, i.e., within a threshold difference. The logic element 412 will change state only when there is a difference in value between the voltages at nodes A' and B' that exceeds a threshold value.

In accordance with an embodiment, the capacitance variation determination circuit 400 also comprises a buffer 430 coupled via connection 442 to node A', and a buffer 436 coupled via connection 434 to node B'. The buffers 430 and 436 are designed to have a substantially similar response. The output of the buffer 430 on connection 432 is arbitrarily designated phase (PH) 1 and the output of the buffer 436 on connection 438 is arbitrarily designated phase (PH) 2. The signals PH 1 and PH 2 are supplied to a logic element 450. In this example, the logic element 450 is a phase detector implemented, for example, as a D-flip-flop. The logic element 450 is used to determine the relative magnitudes of the capacitances 410 and 420. The signal PH1 is supplied to the D input of the logic element 450 and the signal PH2 is supplied to the clock input of the D flip-flop 450. The output of the logic element 450 on connection 452 is referred to as COMPARE OUT. The logic element 450 can be used to determine which of the capacitances 410 and 420 is larger by comparing the phase of the signals at nodes A' and B'. The larger capacitance will cause a lagging phase. Further, an array of capacitance variation determination circuits 400 that are linearly spaced in one dimension can be used to identify a capacitance gradient with respect to that dimension.

Figure 5:
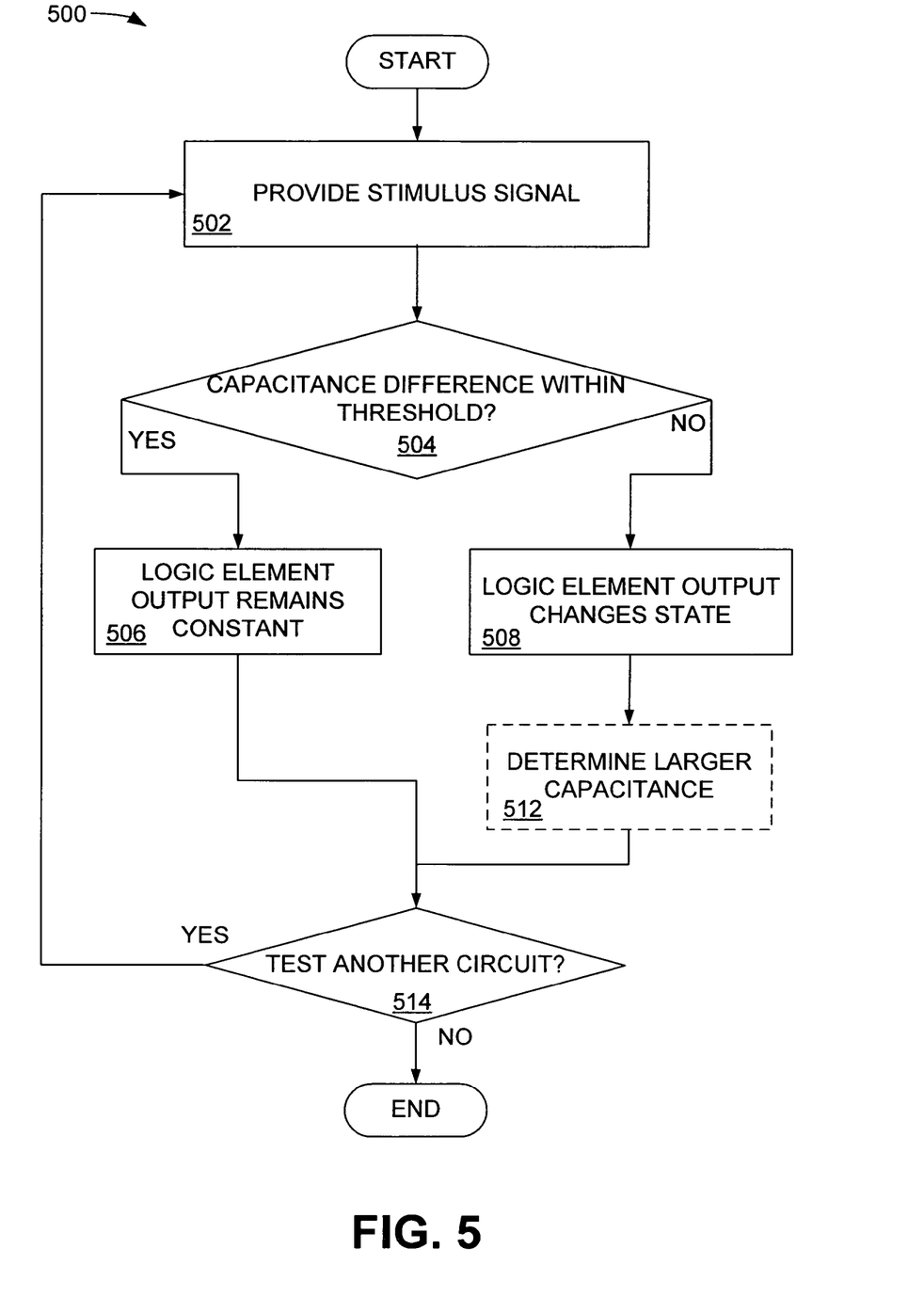
FIG. 5 is a flowchart showing the operation of an embodiment of the capacitance variation determination circuits of FIGS. 1 and 4.

FIG. 5 is a flowchart showing the operation of an embodiment of the capacitance variation determination circuits 100 and 400 of FIGS. 1 and 4, respectively. In block 502, a stimulus signal is provided to the capacitance variation determination circuit. The stimulus signal changes state. In block 504, it is determined whether the capacitance difference between at least two capacitances is within a threshold. If the capacitance difference between at least two capacitances is within the threshold, then, in block 506, the state of the logic element 112 (FIG. 1) remains constant in response to the state change of the stimulus signal. If, in block 504 it is determined that the capacitance difference between at least two capacitances exceeds the threshold then, in block 508, the state of the logic element 112 (FIG. 1) changes in response to the state change of the stimulus signal, causing the output of the logic element 116 (FIG. 1) to toggle. In block 512, the larger of the capacitances is optionally determined as described above in FIG. 4. In block 514 it is determined whether another circuit portion is to be tested or if the same circuit is to be tested again. If another circuit portion is to be tested or if the same circuit portion is to be tested again, then the process returns to block 502. If no additional circuit portions are to be tested or retested then the process ends.

Figure 6:
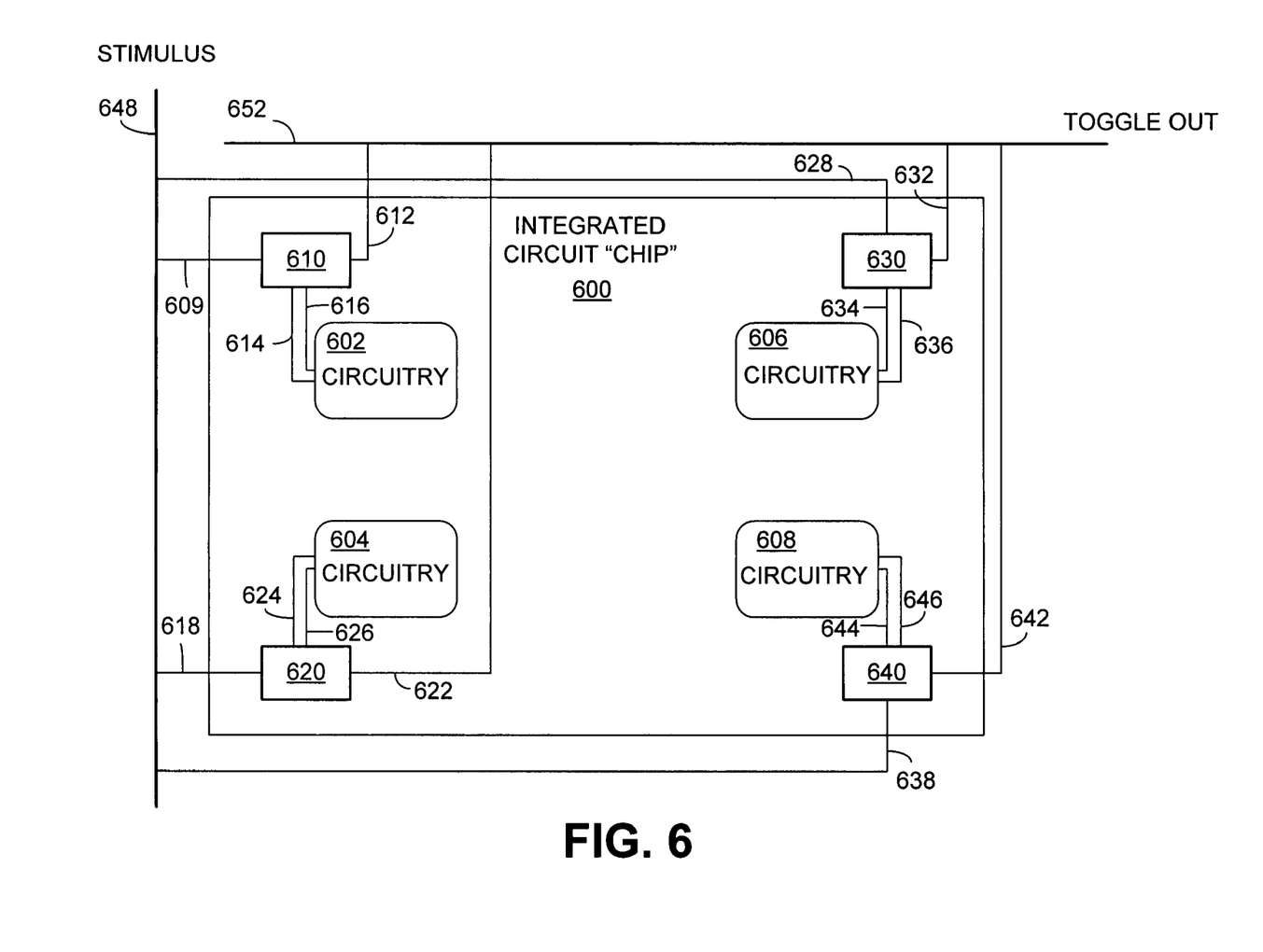
FIG. 6 is a schematic diagram illustrating a portion of an integrated circuit in which the capacitance variation determination circuit can be implemented.

FIG. 6 is a schematic diagram illustrating a portion of an integrated circuit in which the capacitance variation determination circuit can be implemented. An integrated circuit 600 generally comprises a number of different circuit portions. These circuit portions, labeled "circuitry" in FIG. 6, are indicated using reference numerals 602, 604, 606 and 608. Four integrated circuit portions are shown for simplicity. The circuit portions 602, 604, 606 and 608 may be entirely different circuit portions or may be multiple instances of the same or similar circuitry. Typically, many hundreds or thousands of circuit portions are typically implemented on a single chip. The integrated circuit also comprises a number of capacitance variation determination circuits. In this example, four capacitance variation determination circuits are shown in FIG. 6 and labeled 610, 620, 630 and 640.

Each of the capacitance variation determination circuits 610, 620, 630 and 640 is coupled to a stimulus bus 648. The stimulus bus 648 provides a stimulus input to each of the capacitance variation determination circuits 610, 620, 630 and 640 at an appropriate time. For example, the stimulus bus 648 may be a bus having multiple control lines, with a separate control line coupled to each of the capacitance variation determination circuits 610, 620, 630 and 640. In an embodiment, the capacitance variation determination circuits 610, 620, 630 and 640 are coupled to the stimulus bus 648 via connections 609, 618, 628 and 638, respectively.

Each of the capacitance variation determination circuits 610, 620, 630 and 640 is coupled to an output bus 652. The output bus 652 provides a connection for communicating the output of each of the capacitance variation determination circuits 610, 620, 630 and 640 at an appropriate time. The output provided by the output bus 652 is the output on connection 118 (FIG. 1) as described above. The output bus 652 may be a bus having multiple control lines, with a separate control line coupled to each of the capacitance variation determination circuits 610, 620, 630 and 640. In an embodiment, the capacitance variation determination circuits 610, 620, 630 and 640 are coupled to the output bus 652 via connections 612, 622, 632 and 642, respectively.

Each of the capacitance variation determination circuits 610, 620, 630 and 640 is coupled to a respective circuit portion 602, 604, 606 and 608, respectively. The capacitance variation determination circuit 610 is coupled to the circuit portion 602 via connections 614 and 616. The connections 614 and 616 represent connections to at least two capacitances within the circuit portion 602. The at least two capacitances are analyzed by the capacitance variation determination circuit 610 as described above. The capacitance variation determination circuit 620 is coupled to the circuit portion 604 via connections 624 and 626. The connections 624 and 626 represent connections to at least two capacitances within the circuit portion 604. The capacitance variation determination circuit 630 is coupled to the circuit portion 606 via connections 634 and 636. The connections 634 and 636 represent connections to at least two capacitances within the circuit portion 606. The capacitance variation determination circuit 640 is coupled to the circuit portion 608 via connections 644 and 646. The connections 644 and 646 represent connections to at least two capacitances within the circuit portion 608. The at least two capacitances in each of the circuit portions 604, 606 and 608 are analyzed by the capacitance variation determination circuits 620, 630 and 640, respectively, as described above.

This disclosure describes the invention in detail using illustrative embodiments. However, it is to be understood that the invention defined by the appended claims is not limited to the precise embodiments described.

What is claimed is:

1. A capacitance variation determination circuit incorporated into an integrated circuit, comprising:
   at least first and second parasitic capacitances, the first parasitic capacitance being associated with a first portion of the integrated circuit and having a first capacitance value associated therewith, the second parasitic capacitance being associated with a second portion of the integrated circuit and having a second capacitance value associated therewith;
   means for providing a transient stimulus signal to the capacitance variation determination circuit and the at least first and second parasitic capacitances;
   a first logic element operably coupled to the at least first and second parasitic capacitances, the first logic element being configured to switch state: (a) upon detecting the transient stimulus signal, and (b) when a difference between the first and second values exceeds a predetermined amount, and
   means, operably coupled to the first logic element, for providing an output signal indicative of whether the difference exceeds the predetermined amount.

2. The apparatus of claim 1,
   wherein the output signal providing means comprises a second logic element coupled to the first logic element, the second logic element being configured to change state upon the state transition of the first logic element.

3. The apparatus of claim 1, wherein the first logic element is an exclusive NOR gate.

4. The apparatus of claim 1, wherein when the difference exceeds the predetermined amount, and an anomaly at the inputs to the first logic element causes the first logic element to transition state.

5. The apparatus of claim 1, further comprising a third logic element coupled to the inputs of the first logic element, the third logic element being configured to determine a phase difference between the inputs to the first logic element.

6. The apparatus of claim 5, wherein the phase difference between the inputs to the first logic element is indicative of which of the at least first and second capacitances is larger.

7. The apparatus of claim 1, wherein the first and second parasitic capacitances are generated by data lines, circuit traces or circuit components.

8. A method for determining parasitic capacitance variation in first and second portions of an integrated circuit, comprising:
   providing at least first and second parasitic capacitances corresponding to the first and second portions of the integrated circuit, the first and second parasitic capacitances having first and second capacitance values associated therewith, respectively;
   providing a transient stimulus signal to the at least first and second parasitic capacitances;

coupling a first logic element to the transient stimulus signal and to the at least first and second parasitic capacitances;

causing the first logic element to switch state: (a) upon detecting the transient stimulus signal, and (b) when a difference between the first and second values exceeds a predetermined amount, and providing an output signal indicative of whether the difference exceeds the predetermined amount.

9. The method of claim 8, further comprising:

coupling a second logic element to the first logic element; and causing the second logic element to change state upon the state transition of the first logic element.

10. The method of claim 8, wherein the first logic element is an exclusive NOR gate.

11. The method of claim 8, wherein when the difference between the first and second values exceeds the predetermined amount, an anomaly at the inputs to the first logic element causes the first logic element to transition state.

12. The method of claim 8, further comprising:

coupling a third logic element to the inputs of the first logic element; and using the third logic element to determine a phase difference between the inputs to the first logic element.

13. The method of claim 12, wherein the phase difference between the inputs to the first logic element is indicative of which of the at least first and second capacitances is larger.

14. An integrated circuit, comprising:

a plurality of circuit portions;

at least first and second parasitic capacitances associated with each of the plurality of circuit portions, the first and second parasitic capacitances having first and second capacitance values associated therewith;

means for providing a transient stimulus signal to the at least first and second parasitic capacitances;

a first logic element associated with each of the plurality of circuit portions and coupled to the transient stimulus signal providing means and to the at least first and second capacitances, the first logic element being configured to switch state: (a) upon detecting the stimulus signal, and (b) when a difference between the first and second values exceeds a predetermined amount, and means, operably coupled to the first logic element, for providing an output signal indicative of whether the difference exceeds the predetermined amount.

15. The integrated circuit of claim 14, further comprising:

a second logic element associated with each of the plurality of circuit portions and coupled to the first logic element, the second logic element being configured to change state upon the state transition of the first logic element.

16. The integrated circuit of claim 14, wherein the first logic element is an exclusive NOR gate.

17. The integrated circuit of claim 14, wherein when the difference between the first and second values exceeds the predetermined amount, an anomaly at the inputs to the first logic element causes the first logic element to transition state.

18. The integrated circuit of claim 14, further comprising a third logic element associated with each of the plurality of circuit portions and coupled to the inputs of the first logic element, the third logic element being configured to determine a phase difference between the inputs to the first logic element.

19. The integrated circuit of claim 18, wherein the phase difference between the inputs to the first logic element is indicative of which of the first and second capacitances is larger.

20. The integrated circuit of claim 14, wherein the first and second parasitic capacitances are generated by data lines, circuit traces or circuit components.

* * * * *